US011819838B2

(12) United States Patent
Nakagawa et al.

(10) Patent No.: US 11,819,838 B2
(45) Date of Patent: Nov. 21, 2023

(54) PRECURSOR SUPPLY SYSTEM AND PRECURSORS SUPPLY METHOD

(71) Applicant: L'Air Liquide Société Anonyme pour l'Etude et l'Exploitation des Procédés Georges Claude, Paris (FR)

(72) Inventors: Toshiyuki Nakagawa, Hyogo (JP); Kouki Morimoto, Tokyo (JP); Kazutaka Yanagita, Tsukuba (JP); Takashi Kameoka, Tsukuba (JP); Yuki Kumamoto, Tsukuba (JP); Kazuma Suzuki, Tsukuba (JP); Mikio Goto, Tokyo (JP)

(73) Assignee: L'Air Liquide, Société Anonyme pour l'Etude et l'Exploitation des Procédés Georges Claude, Paris (FR)

( * ) Notice: Subject to any disclaimer, the term of this patent is extended or adjusted under 35 U.S.C. 154(b) by 948 days.

(21) Appl. No.: 16/096,085

(22) PCT Filed: Mar. 28, 2017

(86) PCT No.: PCT/JP2017/012564
§ 371 (c)(1),
(2) Date: Oct. 24, 2018

(87) PCT Pub. No.: WO2017/187866
PCT Pub. Date: Nov. 2, 2017

(65) Prior Publication Data
US 2019/0134586 A1 May 9, 2019

(30) Foreign Application Priority Data

Apr. 26, 2016 (JP) .................................. 2016-088408

(51) Int. Cl.
*B01J 4/02* (2006.01)
*C23C 16/448* (2006.01)
*C23C 16/52* (2006.01)
(Continued)

(52) U.S. Cl.
CPC ............... *B01J 4/02* (2013.01); *C23C 16/448* (2013.01); *C23C 16/52* (2013.01); *F17C 7/02* (2013.01); *H01L 21/205* (2013.01)

(58) Field of Classification Search
CPC .... B01J 4/02; H01L 21/205; H01L 21/67011; C23C 16/448; C23C 16/52;
(Continued)

(56) References Cited

U.S. PATENT DOCUMENTS

| 6,038,919 A | 3/2000 | Schmitt et al. |
| 2003/0072875 A1* | 4/2003 | Sandhu .................. C23C 16/52 |
| | | 427/248.1 |

(Continued)

FOREIGN PATENT DOCUMENTS

| JP | 2000 080477 | 3/2000 |
| JP | 2000 513110 | 10/2000 |

(Continued)

OTHER PUBLICATIONS

Machine Translation, JP 2013-249511 (Year: 2013).*
(Continued)

*Primary Examiner* — Michael G Miller
(74) *Attorney, Agent, or Firm* — Allen E. White

(57) ABSTRACT

The present invention provides a supply system enabling a precursor of a solid material or a precursor of a liquid material to be supplied to a latter process at no higher concentration than required and also at or above a predetermined concentration.
A supply system 1 comprises: a vessel 11 for receiving a precursor material; a vessel heating unit for heating the vessel at a set temperature; a carrier gas heating unit which is disposed in an introduction line L1 and heats a carrier gas; a main measurement unit which is disposed in an outward conduction line L2 and obtains data relating to a gas of the precursor; and a carrier gas temperature control unit for controlling the temperature of the carrier gas heating unit in accordance with a measurement result of the main measurement unit.

4 Claims, 3 Drawing Sheets

(51) Int. Cl.
  *F17C 7/02*   (2006.01)
  *H01L 21/205*   (2006.01)
(58) Field of Classification Search
  CPC ....... C23C 16/4481; F17C 7/02; B01B 1/005; B01D 3/346; B01D 1/0082; H01J 37/3244
  USPC ................ 427/248.1–255.7; 118/715–730
  See application file for complete search history.

(56) References Cited

U.S. PATENT DOCUMENTS

| | | |
|---|---|---|
| 2003/0145789 A1 | 8/2003 | Bauch et al. |
| 2008/0191153 A1 | 8/2008 | Marganski et al. |
| 2009/0181168 A1 | 7/2009 | Chaubey et al. |
| 2015/0191819 A1* | 7/2015 | Hendrix ................ C23C 16/458 118/728 |

FOREIGN PATENT DOCUMENTS

| | | |
|---|---|---|
| JP | 2003 527481 | 9/2003 |
| JP | 2004 323894 | 11/2004 |
| JP | 2008 538158 | 10/2008 |
| JP | 2011 509351 | 3/2011 |
| JP | 2013 249511 | 12/2013 |
| JP | 2013249511 A * | 12/2013 |
| JP | 2015 519478 | 7/2015 |

OTHER PUBLICATIONS

International Written Opinion for corresponding PCT/JP2017/012564, dated Jun. 20, 2017, English translation.

International Search Report for corresponding PCT/JP2017/012564, dated Jun. 20, 2017.

* cited by examiner

[Fig. 1]
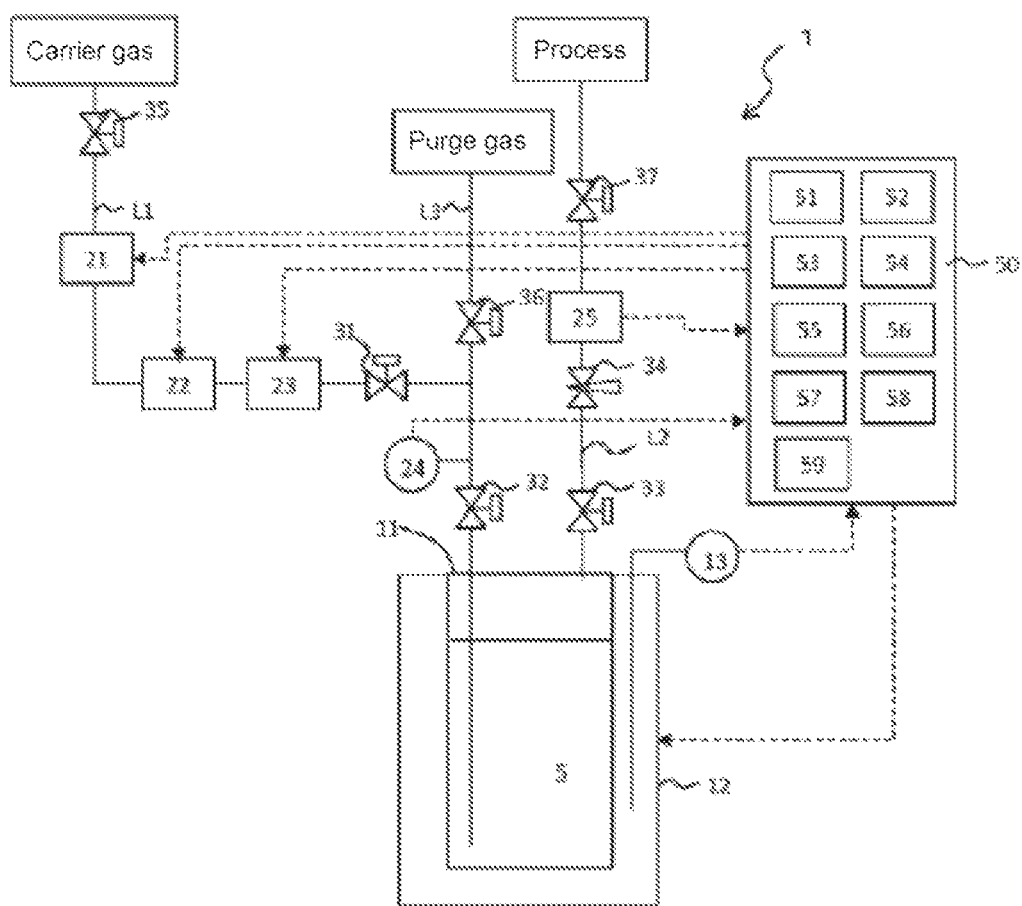

[Fig. 2]
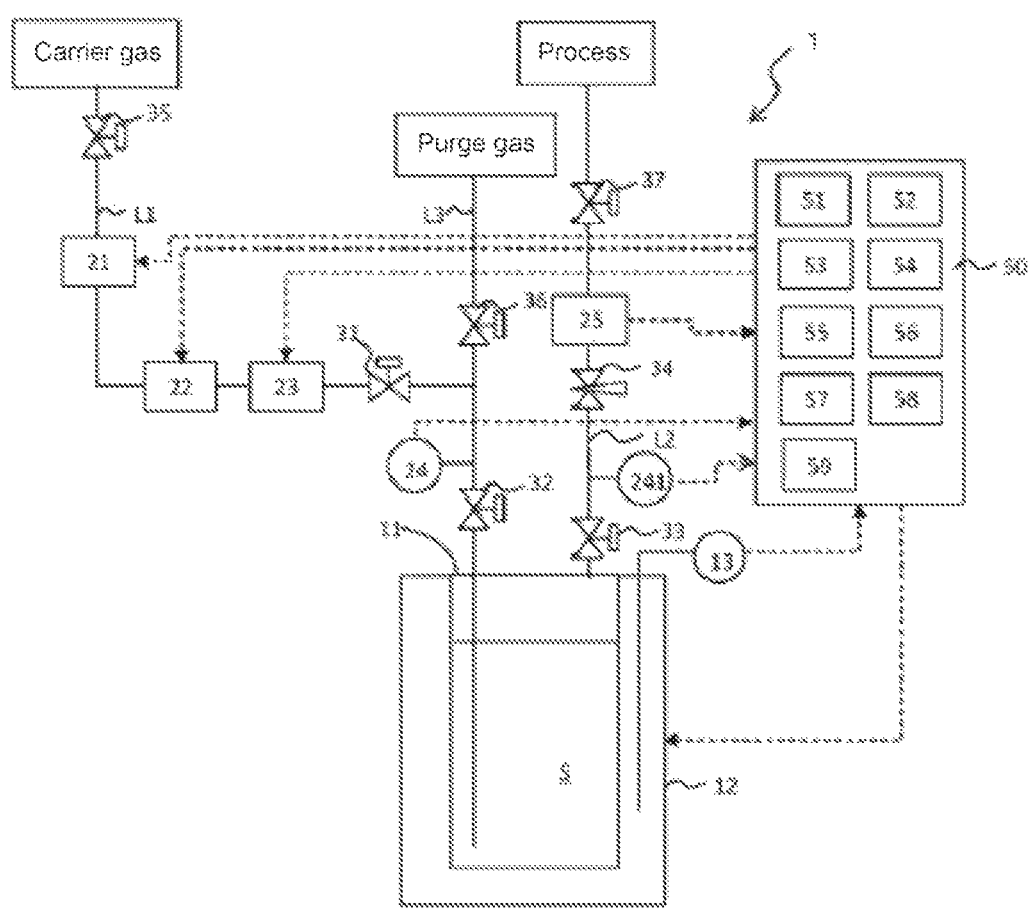

[Fig. 3]
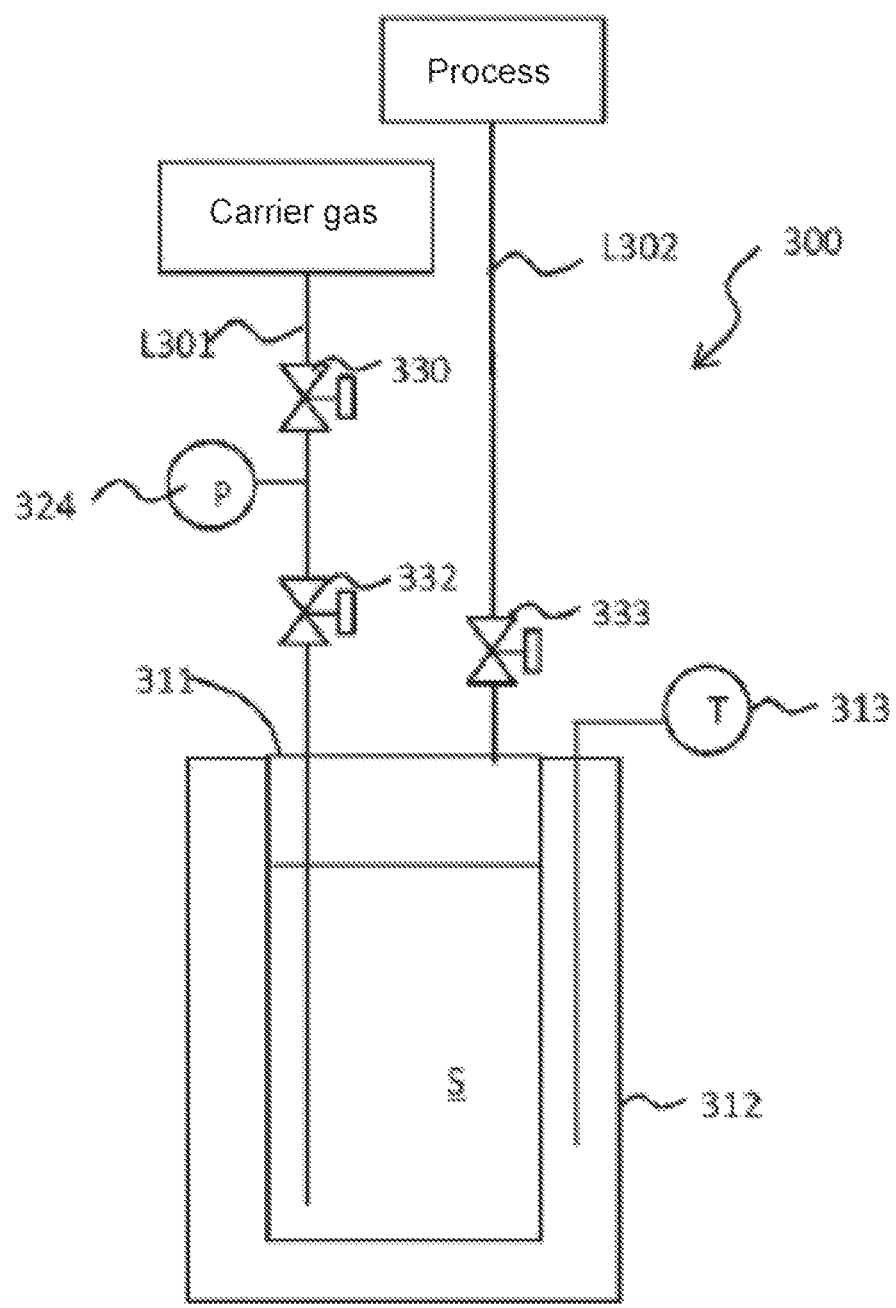

PRECURSOR SUPPLY SYSTEM AND PRECURSORS SUPPLY METHOD

CROSS REFERENCE TO RELATED APPLICATIONS

This application is a 371 of International Application PCT/JP2017/012564, filed Mar. 28, 2017, which claims priority to Japanese Patent Application 2016-088408, filed Apr. 26, 2016, the entire contents of which are incorporated herein by reference.

BACKGROUND

Technical Field

The present invention relates to a gas supply system and supply method for supplying a precursor to a latter process. Furthermore, the present invention relates to a precursor amount detection system and a precursor amount detection method for detecting an amount of a precursor.

Background Art

It is necessary to form a film of various materials on a substrate in order to produce microelectronics devices such as semiconductor integrated devices and liquid crystal panels. Furthermore, it has become practice in recent years to form a dry coating on various members to improve characteristics such as strength of those members. Widely known methods of film formation and coating include physical vapor deposition (PVD), chemical vapor deposition (CVD), and atomic layer deposition (ALD).

As the semiconductor industry advances, the vapor pressure of precursors used for film formation has tended to decrease in order to satisfy stringent film requirements. Examples of precursors used for film formation which may be mentioned include organometallic compounds and inorganic compounds of aluminum, barium, bismuth, chromium, cobalt, copper, gold, hafnium, indium, iridium, iron, lanthanum, lead, magnesium, molybdenum, nickel, niobium, platinum, ruthenium, silver, strontium, tantalum, titanium, tungsten, yttrium and zirconium. Furthermore, inorganic metal compounds are generally used as precursors for dry coating in order to form a carbon-free film. The precursor materials are solid materials or liquid materials.

Since the vapor pressure is low, these materials must be sublimed for supply when they are introduced into a film formation chamber in the case of solid materials, and must be vaporized for supply in the case of liquid materials. Methods of raising the temperature of a vessel include an oven method in which the vessel is introduced into an oven and the solid material or liquid material inside the vessel is indirectly heated, and a heater method in which the vessel itself is directly heated by a heater.

For example, Patent Document 1 indicates that a plurality of trays are disposed in the interior of a solid-material vessel to increase the surface area over which a carrier gas contacts a solid material, and a precursor in a saturation amount is entrained with the carrier gas whereby a large amount of the precursor is supplied more stably than in the case of a conventional vessel without built-in trays.

Patent Document 2 indicates that a precursor is supplied at a predetermined concentration by controlling a heating temperature of a solid-material vessel in accordance with the flow rate of a carrier gas and a precursor (sublimation gas) conducted from the solid-material vessel.

Furthermore, the residual amount of the solid material and liquid material is generally detected by employing a method in which the weight of the material vessel is detected, or the residual amount of the materials is detected by anticipating a consumption amount (residual amount) or calculating the consumption amount based on a predetermined operating time.

PRIOR ART DOCUMENTS

Patent Documents

Patent Document 1: JP 2011-509351 A
Patent Document 2: US 2003/0072875

SUMMARY OF THE INVENTION

Problems to be Solved by the Invention

However, the structure of the vessel is complex in the case of the method in Patent Document 1, and work is involved in charging the solid material and washing the vessel.

Furthermore, when the solid material is sublimed for supply or when the liquid material is vaporized for supply, the amount of precursor supplied decreases as the supply time elapses. The heat of sublimation is greater than the heat of vaporization in the case of solid materials, in particular, so it is more difficult to entrain the precursor in a saturation amount with the carrier gas because of a reduction in the residual amount, and therefore the amount of gas generated is likely to drop further as the supply time elapses. It is important to supply the precursor (sublimation gas, vaporization gas) at or above a predetermined concentration in order to form a uniform film.

The heater of the solid-material vessel can be rapidly heated in the case of the method in Patent Document 2. However, the rate at which the temperature of the precursor inside the vessel rises is slower than the heating rate of the heater. There are consequently concerns that the vessel temperature will overshoot because a cooling means is not provided in Patent Document 2. Furthermore, even if a cooling means is provided, a time lag occurs in the cooling so there are concerns that the temperature of the precursor inside the vessel will overshoot. If there is a delay in tracking the vessel temperature in a film forming process in which supply and stoppage of the precursor are repeated for short periods of time in particular, there are fluctuations in the concentration of precursor supplied to the film formation chamber and this adversely affects the film forming process.

Meanwhile, the vessel temperature is controlled in Patent Document 2, so there is a possibility of the precursor being supplied at a far higher concentration than the concentration of precursor required for a process such as a film forming process, and there are also concerns that the precursor will be needlessly consumed.

Furthermore, the vessel itself needs to be heated to a high temperature in Patent Document 2, so it is very difficult to accurately detect the weight value detected by a weight gauge because of expansion and contraction caused by the change in temperature of supply pipes and the vessel itself, and zero-point drift caused by the change in temperature of the weight gauge itself. Furthermore, the weight gauge is still introduced inside the oven in the case of the oven method, so the same problem occurs.

Furthermore, there is also a large error in calculating the consumption amount, purely because of the calculated value, depending on the operating conditions and fluctuations in those operating conditions (e.g., intermittent supply, etc.).

The aim of the present invention lies in providing a supply system and a supply method enabling a precursor of a solid material or a precursor of a liquid material to be supplied to a latter process at no higher concentration than required and also at or above a predetermined concentration. Furthermore, the present invention provides a precursor amount detection system and a precursor amount detection method enabling detection of an amount (e.g., a residual amount) of a precursor, inside a heating vessel, which is sublimed and supplied from the heating vessel.

DESCRIPTION OF PREFERRED EMBODIMENTS

A precursor supply system according to the present invention comprises:

a vessel for receiving a precursor material;
a vessel heating unit for heating the vessel at a preset set temperature;
an introduction line through which a carrier gas introduced into the vessel flows;
a carrier gas heating unit which is disposed in the introduction line and heats the carrier gas;
an outward conduction line for conducting a gas of the precursor together with the carrier gas out from the vessel to a latter process;
a main measurement unit for obtaining data relating to the precursor gas; and
a carrier gas temperature control unit for controlling the temperature of the carrier gas heating unit in accordance with a measurement result of the main measurement unit.

The supply system may also comprise a vessel heating control unit for controlling the temperature of the vessel heating unit in a first set temperature range from a first threshold temperature lower than the set temperature up to a second threshold temperature higher than the set temperature.

The abovementioned vessel may have a structure in which a plurality of trays are received therein, or a structure without trays.

The vessel heating unit may be an oven able to receive the vessel, it may be a heater which is arranged in such a way as to directly contact or lie close to (e.g., a gap between a vessel outer surface and the vessel heating unit is no greater than 1 mm) the area around the vessel, in order to heat said vessel directly, or it may have a configuration combining an oven and a heater.

The carrier gas heating unit is a heat exchanger, for example, and it may heat and cool the carrier gas in a temperature range of 20-300° C., for example.

The introduction line and the outward conduction line may be gas pipes. The introduction line may be connected to a carrier gas supply source (e.g., a compressed gas cylinder or the like) by way of a gate valve.

The outward conduction line may be connected to a latter process such as a semiconductor production apparatus.

The main measurement unit may measure, as data relating to the gas, the gas flow rate, precursor gas concentration, pressure inside the vessel, gas pressure, for example, among other things. The main measurement unit may have a flowmeter for measuring the gas flow rate, and may have a concentration gauge for detecting the gas concentration.

Furthermore, the main measurement unit may have a pressure gauge for measuring the gas pressure inside the vessel. The amount of precursor gas generated may be obtained in accordance with the gas flow rate, precursor gas concentration, pressure inside the vessel, or gas pressure.

The first set temperature range may be set in accordance with characteristics of a solid or liquid material. It may be set in accordance with the required gas generation amount.

According to the abovementioned configuration, the temperature of the carrier gas may be controlled by variable switching from a fixed temperature in accordance with the data (e.g., flow rate, concentration, pressure) relating to the gas discharged from the vessel. This makes it possible for the high-temperature carrier gas to be brought into direct contact with the precursor material, so it is possible to rapidly respond to a reduction in the temperature of the precursor material. Furthermore, this is particularly effective when there is a relatively small reduction in the generated amount of gas discharged from the vessel.

The abovementioned invention may further comprise:

a vessel temperature measurement unit for measuring the temperature of the vessel heating unit; and
a vessel temperature control unit for controlling the vessel heating unit in accordance with a measured temperature measured by the vessel temperature measurement unit and the set temperature of the vessel heating unit.

The abovementioned invention may further comprise:

a vessel temperature variable control unit for controlling, in accordance with the measurement result of the main measurement unit and/or the temperature of the carrier gas heating unit controlled by means of the carrier gas temperature control unit, the vessel heating unit in a second set temperature range from a third threshold temperature lower than the set temperature up to a fourth threshold temperature higher than the set temperature; and
a switching unit for switching, at a predetermined timing, control of the vessel heating unit afforded by the vessel temperature control unit and control of the vessel heating unit afforded by the vessel temperature variable control unit.

The second set temperature range may be set in accordance with characteristics of a solid or liquid material. It may be set in accordance with the required gas generation amount.

The "predetermined timing" may be set in accordance with the type of precursor material, for example. The switching unit may switch from control of the vessel heating unit to control afforded by the vessel temperature variable control unit at a timing at which the amount of precursor gas generation afforded by increased heat input from the carrier gas falls below a threshold value, for example.

The vessel temperature measurement unit may be configured to measure the inside of the oven, in the case of an oven, or it may measure the temperature of the vessel heating unit itself (the heater itself). There is no particular limitation to the measurement means, and it may be a contact or contactless temperature gauge.

According to the abovementioned configuration, it is possible to directly control the temperature of the vessel by means of the vessel temperature variable unit, so heat is readily imparted to the precursor material and it is possible to increase the generated amount of gas (sublimation gas, vaporization gas) discharged from the vessel in comparison with when the carrier gas temperature is controlled.

(Case in Which the Amount of Precursor Generated is Controlled by Flow Rate)

For example, the following is implemented when the precursor is a solid material and the amount of precursor generated is controlled by the flow rate. It should be noted that the same control is possible even if the precursor is a liquid material, and it is possible to substitute the solid material below with a liquid material, the solid material temperature with the liquid material temperature, and the solid vapor pressure with the liquid vapor pressure.

A target temperature calculation unit calculates a target solid vapor pressure SPs using the following equation.

$$SPs = SQs \times SPt/(SQc+SQs)$$

Here, SQc is a set flow rate [sccm] of the carrier gas, SPt is a set pressure [Torr] inside the vessel, and SQs is a target generation amount of the sublimation gas.

The target temperature calculation unit calculates a target solid material temperature (STs) from the target solid vapor pressure SPs and a vapor pressure curve (pressure [Torr]–temperature [K] curve) of the solid material.

An effective temperature calculation unit calculates an effective generation amount PQs using the following equation.

$$PQs = (PQt - PQc) \times CV$$

Here, PQt is a gas flow rate measured by the main measurement unit (corresponding to a flowmeter), PQc is a carrier gas flow rate, and CV is a conversion factor of the material. This is a conversion factor for accurately calculating the precursor gas flow rate when the flowmeter is calibrated with the carrier gas.

The effective temperature calculation unit calculates an effective solid vapor pressure PPs using the following equation.

$$PPs = PQs \times PPt/(PQc+PQs)$$

Here, PQc is the flow rate [sccm] of the carrier gas, PPt is a pressure [Torr] inside the vessel, and PQs is the effective generation amount of the sublimation gas. For the pressure (PPt) inside the vessel, the pressure inside the vessel may be directly measured, or the pressure inside the pipe of the introduction line or the outward conduction line connected to the vessel may equally be measured.

The effective temperature calculation unit calculates an effective solid material temperature (PTs) from the effective solid vapor pressure PPs and a vapor pressure curve (pressure [Torr]–temperature [K] curve) of the solid material.

The carrier gas temperature control unit controls the temperature of the carrier gas heating unit in accordance with the target solid material temperature (STs) and the effective solid material temperature (PTs), in such a way that the target solid vapor pressure (SPs) is maintained.

The vessel temperature variable control unit controls the temperature of the vessel heating unit in accordance with the target solid material temperature (STs) and the effective solid material temperature (PTs).

(Case in Which the Amount of Precursor Generated is Controlled by Pressure)

For example, the following is implemented when the precursor is a solid material and the amount of precursor generated is controlled by the pressure. It should be noted that the same control is possible even if the precursor is a liquid material, and it is possible to substitute the solid material below with a liquid material, the solid material temperature with the liquid material temperature, and the solid vapor pressure with the liquid vapor pressure.

The main measurement unit (corresponding to a pressure gauge) for measuring the pressure (PPt) inside the vessel is disposed in the introduction line to the vessel or in the outward conduction line, but the pressure can be more accurately measured when it is disposed in the outward conduction line. When the pressure gauge is disposed in the outward conduction line, it is disposed upstream of a flow rate regulating valve disposed in the outward conduction line, for example. This is because the pressure in the outward conduction line is equivalent to the pressure inside the vessel upstream of the flow rate regulating valve.

The set pressure SPt [Torr] inside the vessel is expressed by the following equation.

$$SPt = SPc + SPs$$

Here, SPc is a pressure in a state in which the carrier gas is flowing at SQc [SCCM] which is the set flow rate, and SPs is the target solid vapor pressure.

The target solid vapor pressure SPs can therefore be expressed by the following equation.

$$SPs = SPt - SPc$$

The effective solid vapor pressure PPs inside the vessel is calculated using the following equation.

$$PPs = PPt - PPc$$

Here, PPc is a carrier gas pressure in a state in which the carrier gas is flowing at the flow rate PQc [SCCM]. PQc is the carrier gas flow rate and is controlled to a constant flow rate by means of a mass flow controller disposed in the introduction line, for example. The following equation is established when said flow rate is controlled to a constant flow rate.

$$SPc = PPc$$

The effective temperature calculation unit calculates the effective solid material temperature (PTs) from the effective solid vapor pressure PPs and a vapor pressure curve (pressure [Torr]–temperature [K] curve) of the solid material.

The carrier gas temperature control unit controls the temperature of the carrier gas heating unit in accordance with the target solid material temperature (STs) and the effective solid material temperature (PTs), in such a way that the target solid vapor pressure (SPs) is maintained.

The vessel temperature variable control unit controls the temperature of the vessel heating unit in accordance with the target solid material temperature (STs) and the effective solid material temperature (PTs).

Furthermore, the supply system may implement the following (1) through (4), or repeatedly implement (1) through (4).

(1) When the vessel heating unit is controlled at the set temperature (e.g., the target solid material temperature STs) by the vessel temperature control unit, the carrier gas temperature control unit controls the temperature of the carrier gas heating unit from the set temperature (e.g., the target solid material temperature STs) in the range of the second threshold temperature, in accordance with the tendency of the effective solid material temperature (PTs) (e.g., a case in which the tendency of the effective solid material temperature (PTs) is to increase in proportion to time).

(2) If the tendency of the effective solid material temperature (PTs) is to increase in proportion to time, when the carrier gas temperature control unit is controlling the temperature of the carrier gas heating unit at a temperature that does not reach up to the second threshold temperature (e.g., a temperature lying between from a cooling center position (the vessel heating unit is at the set temperature) up to a heating-side output of 50%), the switching unit performs switching control from the vessel temperature control unit to the vessel temperature variable control unit in accordance with the tendency of the effective solid material temperature (PTs).

The switching unit may switch from the vessel temperature control unit to the vessel temperature variable control unit at the timing of a temperature lying between from the cooling center position (the vessel heating unit is at the set temperature) up to a heating-side output of 50%, or at a timing at which the amount of precursor gas generation afforded by increased heat input from the carrier gas falls below a threshold value, for example.

(3) The carrier gas temperature control unit controls the temperature of the carrier gas heating unit in the first set temperature range in accordance with the tendency of the effective solid material temperature (PTs). And the vessel temperature variable control unit controls the vessel heating unit in the second set temperature range in accordance with the tendency of the effective solid material temperature (PTs).

(4) If the tendency of the effective solid material temperature (PTs) is to decrease in proportion to time, the switching unit performs switching control from the vessel temperature variable control unit to the vessel temperature control unit, and, using a target temperature within the second set temperature range set by the vessel temperature variable control unit as a set temperature during the switching, the vessel temperature control unit controls the vessel heating unit. And the carrier gas temperature control unit controls the temperature of the carrier gas heating unit in the first set temperature range in accordance with the tendency of the effective solid material temperature (PTs).

According to the abovementioned configuration, carrier gas temperature control is used to respond to a case in which the extent of a reduction in the amount of gas (sublimation gas, vaporization gas) generated from the precursor material is relatively small. When the extent of the reduction in the amount of gas generated becomes larger, it is no longer possible to respond to this using carrier gas temperature control, so vessel temperature control is used in response. It is also possible to simultaneously perform carrier gas temperature control while the vessel temperature is being controlled. There is a switch from vessel temperature variable control to constant temperature control afforded by the vessel temperature control unit, based on the tendency of the effective solid material temperature (PTs). In addition, when there is a reduction in the amount of gas generated, the processing of the carrier gas temperature control is repeated. The vessel temperature control requires a predetermined heat transfer time until the heat of the heater is transmitted to the vessel and then further transmitted to the precursor material. The heavier the vessel, or the greater the number of trays, then the longer the heat transfer time. By also simultaneously performing carrier gas temperature control (higher temperature, lower temperature), it is possible to solve the drawback of the heat transfer time.

Furthermore, in the supply system, the fourth threshold temperature in the second set temperature range may be set at a point in time when the residual amount of precursor inside the vessel reaches a replacement level, and said supply system may further comprise a first residual amount detection unit for detecting that the residual amount of the precursor inside the vessel is at the replacement level, in a state in which the vessel heating unit is performing control at the fourth threshold temperature in the second set temperature range, and when the carrier gas heating unit has performed control at the second threshold temperature in the first set temperature range.

According to the abovementioned configuration, it is possible to accurately detect that the residual amount of the precursor material inside the vessel is zero.

Furthermore, the supply system may comprise:

a flow rate control unit (e.g., a mass flow controller) which is disposed in the introduction line and measures the flow rate of the carrier gas and controls the flow rate;

a pressure regulating valve which is disposed downstream of the flow rate control unit in the introduction line and makes the pressure inside the vessel constant; and a pressure gauge which is disposed downstream of the carrier gas heating unit in the introduction line and measures the pressure inside the introduction line, the main measurement unit being a flowmeter (e.g., a mass flow meter) for measuring the flow rate of the carrier gas and the precursor gas, and said supply system may comprise a flow rate regulating valve (e.g., a needle valve) which is disposed upstream of the flowmeter in the outward conduction line and adjusts the flow rate of the carrier gas and the precursor gas;

the pressure regulating valve implementing pressure control in accordance with the pressure measured by the pressure gauge, the flow rate regulating valve being set in such a way that the opening degree of the pressure regulating valve is fully open at the point in time when the residual amount of the precursor inside the vessel reaches the replacement level, and said supply system may further comprise:

a valve opening degree detection unit for detecting the opening degree of the pressure regulating valve; and a second residual amount detection unit for detecting that the residual amount of the precursor inside the vessel is at the replacement level when the valve opening degree detected by the valve opening degree detection unit has exceeded a threshold value.

According to the abovementioned configuration, it is possible to accurately detect that the residual amount of the precursor material inside the vessel is zero.

By providing both the first and second residual amount detection units, it is possible to improve the accuracy of detecting the residual amount or detecting that the vessel is empty.

Furthermore, the supply system may further comprise:

a first pressure gauge disposed downstream of the carrier gas heating unit in the introduction line;

a measurement unit which, when the residual amount of the material inside the vessel is detected, measures an introduction time up to a point in time when an outlet of the vessel on the outward conduction line side or a vessel-side valve on the outward conduction line side has been closed, the carrier gas has been introduced in a fixed amount per unit time from the introduction line, and a threshold pressure higher than the vessel pressure before the carrier gas was introduced has been reached;

an introduction amount calculation unit for calculating the amount of carrier gas introduced, from the introduction time measured by the measurement unit and the fixed amount per unit time;

a spatial volume calculation unit for calculating a spatial volume inside the vessel by correcting the vessel temperature with respect to a difference between the threshold pressure and the vessel pressure before the carrier gas was introduced;

a precursor volume calculation unit for calculating the volume of precursor from the spatial volume calculated by the spatial volume calculation unit and a preset vessel volume; and a third residual amount detection unit for detecting the residual amount of the precursor inside the vessel in accordance with the precursor volume calculated by the precursor volume calculation unit.

According to the abovementioned configuration, it is possible to accurately detect the residual amount of the precursor material inside the vessel. By using a combination of the first, second and third residual detection units, it is possible to improve the accuracy of detecting the residual amount or detecting that the vessel is empty.

Furthermore, the supply system may further comprise:

a second pressure gauge disposed in the outward conduction line;

a measurement unit which, when the residual amount of the precursor inside the vessel is detected, measures an introduction time up to a point in time when a valve disposed downstream of the second pressure gauge has been closed, the carrier gas has been introduced in a fixed amount per unit time from the introduction line, and a threshold pressure higher than the vessel pressure before the carrier gas was introduced has been reached;

an introduction amount calculation unit for calculating the amount of carrier gas introduced, from the introduction time measured by the measurement unit and the fixed amount per unit time;

a spatial volume calculation unit for calculating a spatial volume inside the vessel by correcting the vessel temperature with respect to a difference between the threshold pressure and the vessel pressure before the carrier gas was introduced;

a precursor volume calculation unit for calculating the volume of precursor from the spatial volume calculated by the spatial volume calculation unit and a preset vessel volume; and a fourth residual amount detection unit for detecting the residual amount of the precursor inside the vessel in accordance with the precursor volume calculated by the precursor volume calculation unit.

According to the abovementioned configuration, it is possible to accurately detect the residual amount of the precursor material inside the vessel. By using a combination of the first, second and fourth residual detection units, it is possible to improve the accuracy of detecting the residual amount or detecting that the vessel is empty.

A precursor supply method according to another invention comprises:

a heating step in which a vessel in which a precursor material is received is heated at a preset set temperature by a vessel heating unit;

a main measurement step in which data relating to a gas of the precursor is obtained; and a carrier gas temperature control step in which the temperature of a carrier gas introduced into the vessel is controlled in accordance with a measurement result in the main measurement step in a first set temperature range from a first threshold temperature lower than the set temperature up to a second threshold temperature higher than the set temperature.

The abovementioned supply method may further comprise:

a vessel temperature measurement step in which the temperature of the vessel heating unit is measured; and a vessel temperature control step in which the vessel heating unit is controlled in accordance with a measured temperature measured in the vessel temperature measurement step and the set temperature of the vessel heating unit.

The abovementioned supply method may further comprise:

a vessel temperature variable control step in which the vessel heating unit is controlled in accordance with the measurement result in the main measurement step and/or the temperature of the carrier gas afforded by the carrier gas temperature control step, in a second set temperature range from a third threshold temperature lower than the set temperature up to a fourth threshold temperature higher than the set temperature; and a switching step in which control of the vessel heating unit afforded by the vessel temperature control step and control of the vessel heating unit afforded by the vessel temperature variable control step are switched at a predetermined timing.

The abovementioned supply method may further comprise an effective temperature calculation step in which, when the precursor is a solid material, an effective solid material temperature (PTs) is calculated from an effective solid vapor pressure (PPs) and a vapor pressure curve of the solid material, wherein, in the carrier gas temperature control step, the temperature of the carrier gas may be controlled in the first set temperature range in accordance with the effective solid material temperature (PTs), and in the vessel temperature variable control step, the temperature of the vessel heating unit may be controlled in the second set temperature range in accordance with the effective solid material temperature (PTs).

In the abovementioned supply method, the following (1) through (4) may be repeatedly implemented.

(1) When the vessel heating unit is controlled at the set temperature in the vessel temperature control step, in the carrier gas temperature control step, if the tendency of the effective solid material temperature (PTs) is to increase in proportion to time, the temperature of the carrier gas is controlled from the set temperature of the vessel heating unit in the range of the second threshold temperature.

(2) In the carrier gas temperature control step, if the tendency of the effective solid material temperature (PTs) is to increase in proportion to time, when the temperature of the carrier gas is controlled at a temperature that does not reach up to the second threshold temperature, in the switching step, there is a switch from the vessel temperature control step to the vessel temperature variable control step in accordance with the tendency of the effective solid material temperature (PTs).

(3) In the carrier gas temperature control step, the temperature of the carrier gas heating unit is controlled in the first set temperature range in accordance with the tendency of the effective solid material temperature (PTs), and in the vessel temperature variable control step, the vessel heating unit is controlled in the second set temperature range in accordance with the tendency of the effective solid material temperature (PTs).

(4) In the switching step, if the tendency of the effective solid material temperature (PTs) is to decrease in proportion to time, there is a switch from the vessel temperature variable control step to the vessel temperature control step, and, using a target temperature within the second set temperature range set in the vessel temperature variable control step as a set temperature during the switching, the vessel heating unit performs control in the vessel temperature control step, and the temperature of the carrier gas is controlled in the first set temperature range in the carrier gas temperature control step in accordance with the tendency of the effective solid material temperature (PTs).

According to the abovementioned supply method, the fourth threshold temperature in the second set temperature range may be set at a point in time when the residual amount of precursor inside the vessel reaches a replacement level, and said supply method may further comprise a first residual amount detection step in which it is detected that the residual amount of the precursor inside the vessel is at the replacement level, in a state in which the vessel heating unit is performing control at the fourth threshold temperature in the second set temperature range, and at the point in time when the carrier gas temperature has been controlled at the second threshold temperature in the first set temperature range.

Another invention relates to a precursor amount detection system for detecting an amount, inside a heating vessel, of a precursor sublimed in and supplied from a vessel, e.g., a system able to detect that the precursor is at or below a predetermined amount.

A first precursor amount detection system is a precursor amount detection system for detecting the amount of a precursor inside a vessel, said precursor amount detection system comprising:

a vessel for receiving a precursor material;

an introduction line through which a carrier gas introduced into the vessel flows;

an outward conduction line for conducting a gas of the precursor together with the carrier gas out from the vessel to a latter process;

a first pressure gauge disposed in the introduction line;

a measurement unit which, when the precursor amount inside the vessel is detected, measures an introduction time up to a point in time when an outlet of the vessel on the outward conduction line side or a vessel-side valve on the outward conduction line side has been closed, the carrier gas has been introduced in a fixed amount per unit time from the introduction line, and a threshold pressure higher than the vessel pressure before the carrier gas was introduced has been reached;

an introduction amount calculation unit for calculating the amount of carrier gas introduced, from the introduction time measured by the measurement unit and the fixed amount per unit time;

a spatial volume calculation unit for calculating a spatial volume inside the vessel by correcting the vessel temperature with respect to a difference between the threshold pressure and the vessel pressure before the carrier gas was introduced; and a precursor volume calculation unit for calculating the volume of precursor from the spatial volume calculated by the spatial volume calculation unit and a preset vessel volume.

A second precursor amount detection system is a precursor amount detection system for detecting the amount of a precursor inside a vessel, said precursor amount detection system comprising:

a vessel for receiving a precursor material;

an introduction line through which a carrier gas introduced into the vessel flows;

an outward conduction line for conducting a gas of the precursor together with the carrier gas out from the vessel to a latter process;

a second pressure gauge disposed in the outward conduction line;

a measurement unit which, when the precursor amount inside the vessel is detected, measures an introduction time up to a point in time when a valve disposed downstream of the second pressure gauge has been closed, the carrier gas has been introduced in a fixed amount per unit time from the introduction line, and a threshold pressure higher than the vessel pressure before the carrier gas was introduced has been reached;

an introduction amount calculation unit for calculating the amount of carrier gas introduced, from the introduction time measured by the measurement unit and the fixed amount per unit time;

a spatial volume calculation unit for calculating a spatial volume inside the vessel by correcting the vessel temperature with respect to a difference between the threshold pressure and the vessel pressure before the carrier gas was introduced; and a precursor volume calculation unit for calculating the volume of precursor from the spatial volume calculated by the spatial volume calculation unit and a preset vessel volume.

A first precursor amount detection method is a precursor amount detection method for detecting the amount of precursor inside a vessel, said precursor amount detection method comprising:

an initial pressure measurement step in which, when the amount of precursor inside the vessel is detected, an initial pressure inside the vessel is measured by a first pressure gauge disposed in an introduction line through which a carrier gas is introduced into the vessel;

an introduction time measurement step in which an introduction time up to a point in time when an outlet of the vessel on the side of an outward conduction line through which a precursor gas is conducted out from the vessel or a vessel-side valve on the outward conduction line side has been closed, a carrier gas in a fixed amount per unit time has been introduced from the introduction line, and a threshold pressure higher than the initial pressure measured in the initial pressure measurement step has been reached, is measured;

an introduction amount calculation step in which the amount of carrier gas introduced is calculated from the introduction time and the fixed amount per unit time;

a spatial volume calculation step in which a spatial volume inside the vessel is calculated by correcting the vessel temperature with respect to a difference between the initial pressure and the threshold pressure; and a precursor volume calculation step in which the volume of the precursor is calculated from the spatial volume calculated in the spatial volume calculation step and a preset vessel volume.

A second precursor amount detection method is a precursor amount detection method for detecting the amount of precursor inside a vessel, said precursor amount detection method comprising:

an initial pressure measurement step in which, when the amount of precursor inside the vessel is detected, an initial pressure inside the vessel is measured by a second pressure gauge disposed in an outward conduction line through which a precursor gas is conducted out from the vessel;

a measurement unit which measures an introduction time up to a point in time when a valve disposed downstream of the second pressure gauge has been closed, the carrier gas has been introduced in a fixed amount per unit time from an introduction line through which the carrier gas is introduced into the vessel, and a threshold pressure higher than the initial pressure measured in the initial pressure measurement step has been reached;

an introduction amount calculation step in which the amount of carrier gas introduced is calculated from the introduction time and the fixed amount per unit time;

a spatial volume calculation step in which a spatial volume inside the vessel is calculated by correcting the vessel temperature with respect to a difference between the initial pressure and the threshold pressure; and a precursor volume calculation step in which the volume of the precursor is calculated from the spatial volume calculated in the spatial volume calculation step and a preset vessel volume.

BRIEF DESCRIPTION OF THE DRAWINGS

FIG. 1 schematically shows a supply system according to Mode of Embodiment 1;

FIG. 2 schematically shows a supply system according to Mode of Embodiment 2; and FIG. 3 schematically shows a precursor amount detection system.

MODE FOR IMPLEMENTING THE INVENTION

Several modes of embodiment of the present invention will be described below. The modes of embodiment described below illustrate an example of the present invention. The present invention is not limited in any way to the following modes of embodiment, and also includes different variant modes which are implemented in a scope that does not depart from the essential point of the present invention. It should be noted that the present invention is not limited in terms of all of the components described below being essential components of the invention.

Mode of Embodiment 1

FIG. 1 schematically shows a supply system 1. in this mode of embodiment, a solid material is used as a precursor and nitrogen gas is used as a carrier gas. The supply system 1 comprises an introduction line L1 through which the carrier gas ($N_2$ gas) is introduced up to a vessel 11. The system comprises an outward conduction line L2 through which generated gas (sublimation gas) discharged from the vessel 11 is conducted out to a process. A purge gas introduction line L3 constitutes an introduction line for introducing a purge gas (e.g., nitrogen gas) into the vessel 11.

The vessel 11 houses a solid material which is a precursor. The vessel 11 may have a structure for receiving multiple stages of trays or it may be a trayless vessel. A tip end of the introduction line L1 is disposed in a bottom region of the vessel 11 and the carrier gas is fed therethrough. The carrier gas comes into contact with a solid material S inside the vessel 11.

A heater 12 (corresponding to a vessel heating unit) is provided around the vessel 11 (outer circumference, bottom portion), said heater 12 being arranged in such a way as to lie close to said vessel 11 (e.g. a gap between a vessel outer surface and the vessel heating unit is no greater than 1 mm) and directly heating the vessel 11. A heater temperature control unit 51 (corresponding to a vessel temperature control unit) controls the temperature of the heater 12 at a set temperature (constant value) commensurate with the solid material or with the desired amount of gas generation. For example, when the solid material is $AlCl_3$, the temperature is controlled at any value in the range of 110° C. to 120° C.

The heater 12 is provided with a heater temperature gauge 13 (corresponding to a vessel temperature measurement unit) for measuring the temperature of the heater 12. In this mode of embodiment, the heater temperature gauge 13 is disposed in the interior of the heater. The measured heater measurement temperature is sent to a control unit 50. The heater temperature control unit 51 controls the heater 12 in accordance with a set temperature and the heater measurement temperature in such a way that the heater measurement temperature becomes the set temperature.

A mass flow controller 21 is disposed on an upstream side of the introduction line L1. The mass flow controller 21 measures a flow rate of the carrier gas and controls said flow rate.

A pressure regulating valve 22 is disposed downstream of the mass flow controller 21 in the introduction line L1. The pressure regulating valve 22 has the function of keeping the pressure inside the vessel 11 constant.

A heat exchanger 23 (corresponding to a carrier gas heating unit) is disposed downstream of the pressure regulating valve 22 in the introduction line L1. The heat exchanger 23 heats the carrier gas.

A pressure gauge 24 is disposed downstream of the heat exchanger 23 in the introduction line L1. The pressure gauge 24 measures the pressure inside the introduction line L1. The pressure value measured by the pressure gauge 24 is sent to the control unit 50. The pressure gauge 24 measures the pressure in the introduction line L1, but the pressure here is considered to be the same as the pressure inside the vessel 11.

A mass flow meter 25 (corresponding to a main measurement unit in Mode of Embodiment 1) is disposed in the outward conduction line L2. The mass flow meter 25 measures the flow rate of the carrier gas and the generated gas (sublimation gas) of the solid material S. The measured gas flow rate value is sent to the control unit 50. A heat exchange control unit 52 (corresponding to a carrier gas temperature control unit) controls the temperature of the heat exchanger 23 in accordance with the gas flow rate. The temperature of the heat exchanger 23 (in other words the temperature of the carrier gas) is controlled at 20-200° C., for example. The specific control method will be described later.

A flow rate regulating valve 34 is disposed upstream of the mass flow meter 25 in the outward conduction line L2. The flow rate regulating valve 34 adjusts the flow rate of the carrier gas and the generated gas of the precursor. In a different mode of embodiment, the flow rate regulating valve 34 may equally be disposed downstream of the mass flow meter 25 in the outward conduction line L2.

(Control Method Employing Gas Flow Rate)

Mode of Embodiment 1 relates to a method in which the heater 12 is subjected to constant value control and controls the temperature of the carrier gas, whereby a reduction in the amount of gas generated from the solid material is suppressed.

A target temperature calculation unit 53 calculates a target solid vapor pressure SPs using the following equation.

$$SPs = SQs \times SPt/(SQc+SQs)$$

Here, SQc is a set flow rate [sccm] of the carrier gas. SPt is a set pressure [Torr] inside the vessel, and SQs is a target generation amount of the sublimation gas. These are preset in accordance with the solid material. Next, the target temperature calculation unit 53 calculates a target solid material temperature (STs) from the target solid vapor pressure SPs and a vapor pressure curve (pressure [Torr]–temperature [K] curve) of the solid material. The vapor pressure curve is pre-stored in a memory of the control unit 50.

An effective temperature calculation unit 54 calculates an effective generation amount PQs using the following equation.

$$PQs = (PQt - PQc) \times CV$$

Here, PQt is a gas flow rate [sccm] of the carrier gas and the generated gas measured by the mass flow meter 25, PQc is a carrier gas flow rate [sccm] measured by the mass flow controller 21, and CV is a conversion factor of the material. For example, when the flowmeter calibrated with N2 displays that the solid material is flowing at 1 sccm, then if the actual amount of flow is 0.25 sccm, CV is 0.25.

The effective temperature calculation unit 54 calculates an effective solid vapor pressure PPs using the following equation.

$$PPs = PQs \times PPt / (PQc + PQs)$$

Here, PQc is the flow rate [sccm] of the carrier gas controlled by the mass flow controller 21, PPt is a pressure [Torr] inside the vessel measured by the pressure gauge 24, and PQs is the effective generation amount of the sublimation gas. It should be noted that in another mode of embodiment, the pressure (PPt) inside the vessel may be a pressure which is measured by a pressure gauge disposed in a pipe upstream of the flow rate regulating valve 34 (e.g., a needle valve) in the outward conduction line L2.

The effective temperature calculation unit 54 calculates an effective solid material temperature (PTs) from the effective solid vapor pressure PPs and a vapor pressure curve (pressure [Torr]–temperature [K] curve) of the solid material.

The heat exchange control unit 52 controls the temperature of the heat exchanger 23 in accordance with the target solid material temperature (STs) and the effective solid material temperature (PTs), in such a way that the target solid vapor pressure (SPs) is maintained.

Exemplary Embodiment

A specific Exemplary Embodiment 1 in accordance with Mode of Embodiment 1 will be described below.

Solid material AlCl$_3$ is supplied to a process at 0.06 g/min. The heat of sublimation required at this time is 12.5 cal/min.
Carrier gas flow rate: 200 [sccm]
Pressure inside vessel: approximately 150 Torr
Heater set temperature: 110° C. (AlCl$_3$ vapor pressure: approximately 7 Torr)
Temperature control range of heat exchanger: heating side 110-300° C., cooling side 110-20° C.
Heat input from heat exchanger 23 (Δ190° C.): approximately 12 cal/min The solid material AlCl$_3$ can be supplied to the process at 0.06 g/min under the abovementioned conditions.

A different Exemplary Embodiment 2 will be described.
Solid material AlCl$_3$ is supplied to a process at 2 g/min. The heat of sublimation required at this time is 415 cal/min.
Carrier gas flow rate: 800 [sccm]
Pressure inside vessel: approximately 30 Torr
Heater set temperature: 114° C. (AlCl$_3$ vapor pressure: approximately 9 Torr)
Temperature control range of heat exchanger: heating side 114-300° C., cooling side 114-20° C.
Heat input from heat exchanger 23 (Δ180° C.): approximately 46 cal/min Around 10% of the heat of sublimation is produced under the abovementioned conditions and it is possible to suppress fluctuations to a reduction of 10% in the gas generation amount.

Mode of Embodiment 2

Mode of Embodiment 2 has a configuration in which the heater temperature is variably controlled, in addition to temperature control of the carrier gas in Mode of Embodiment 1.

A heater temperature variable control unit 55 (corresponding to a vessel temperature variable control unit) controls the heater 12 in a temperature region higher than the set temperature controlled to a constant value, in accordance with the gas flow rate measured by the mass flow meter 25 and the set temperature of the heat exchanger 23. For example, the heater temperature variable control unit 55 controls the temperature of the heater 12 in accordance with the target solid material temperature (STs) and the effective solid material temperature (PTs).

A switching unit 56 switches, at a predetermined timing, temperature control of the heater 12 afforded by the heater temperature control unit 51, and temperature control of the heater 12 afforded by the vessel temperature variable control unit 55. The switching timing may be such that a switch is made in accordance with a lower limit temperature and an upper limit temperature in the control temperature range of the heat exchanger 23. The switching unit 56 may switch these in accordance with a tendency of the effective solid material temperature (PTs).

In Mode of Embodiment 2, the control of (step 1) through (step 4) is repeatedly implemented.

(Step 1) When the heater 12 is controlled at the set temperature (e.g., the target solid material temperature STs) by the heater temperature control unit 51, the heat exchange control unit 52 controls the temperature of the heat exchanger 23 from the set temperature (e.g., the target solid material temperature STs) in the range of the second threshold temperature, in accordance with the tendency of the effective solid material temperature (PTs) (e.g., a case in which the tendency of the effective solid material temperature (PTs) is to increase in proportion to time).

(Step 2) If the tendency of the effective solid material temperature (PTs) is to increase in proportion to time, when the heat exchange control unit 52 is controlling the temperature of the heat exchanger 23 at a temperature that does not reach up to the second threshold temperature (e.g., a temperature lying between from a cooling center position up to a heating-side output of 50%), the switching unit 56 performs switching control from the heater temperature control unit 51 to the heater temperature variable control unit 55 in accordance with the tendency of the effective solid material temperature (PTs).

The switching unit 56 may switch from the heater temperature control unit 51 to the heater temperature variable control unit 55 at the timing of any temperature lying between from the cooling center position (e.g., the set temperature of the heater 12) up to a heating-side output of 50%, or at a timing at which the amount of precursor gas generation afforded by increased heat input from the carrier gas falls below a threshold value, for example.

(Step 3) The heat exchange control unit 52 controls the temperature of the heat exchanger 23 in the first set temperature range in accordance with the tendency of the effective solid material temperature (PTs). And the heater temperature variable control unit 55 controls the heater 12 in the second set temperature range in accordance with the tendency of the effective solid material temperature (PTs).

The heat exchange control unit 52 may control the temperature of the heat exchanger 23 at a heating-side output of 50% from a cooling center position, and the heater temperature variable control unit 55 may control the heater 12 to a temperature on the heating side from the cooling center position at a timing of 50% heating-side output from the cooling center position. A temperature increase or temperature decrease on the heating side from the cooling center position, or a temperature decrease or temperature increase on the cooling side from the cooling center position may be set in accordance with the type of solid material in a range of 0.1° C./min to 5.0° C./min, for example.

The heat input afforded by the heater 12 is around 5-20 times the heat input afforded by the carrier gas, for example, so for the temperature control of the heater 12, the temperature of the carrier gas may be controlled on the cooling side from the cooling center position, in accordance with the tendency of the effective solid material temperature (PTs) such as overshooting. Furthermore, heating of the heater 12 may be controlled in such a way that the temperature decreases, in order to enhance the cooling effect utilizing heat input of the heater 12.

(Step 4) If the tendency of the effective solid material temperature (PTs) is to decrease in proportion to time, the switching unit 56 performs switching control from the heater temperature variable control unit 55 to the heater temperature control unit 51, and, using a target temperature within the second set temperature range set by the heater temperature variable control unit 55 as a set temperature during the switching, the heater temperature control unit 51 controls the heater 12. And the heat exchange control unit 52 controls the temperature of the heat exchanger 23 in the first set temperature range in accordance with the tendency of the effective solid material temperature (PTs).

The switching unit 56 may switch control from the heater temperature variable control unit 55 to the heater temperature control unit 51 at the timing of the cooling center position, or at a timing at which the amount of precursor gas generation afforded by increased heat input from the carrier gas falls below a threshold value, for example.

Exemplary Embodiment

A specific exemplary embodiment in accordance with Mode of Embodiment 2 will be described below.

Solid material AlCl$_3$ is supplied to a process at 2 g/min. The heat of sublimation required at this time is 415 cal/min.

Carrier gas flow rate: 800 [sccm]
Pressure inside vessel: approximately 30 Torr
Heater set temperature: 110° C. (AlCl$_3$ vapor pressure: approximately 7 Torr)
Temperature control range of heat exchanger: heating side 110-200° C., cooling side 110-50° C.
Temperature control range of heater: 110-120° C.

In step 0, the heater set temperature is set at 110° C. and the carrier gas temperature is set at 110° C. The effective solid material temperature (PTs) is obtained by means of the abovementioned calculation from the gas flow rate measured by the mass flow meter 25.

In step 1, the temperature of the heat exchanger 23 is controlled from 110 to 150° C., from the tendency of the effective solid material temperature (PTs).

In step 2, when temperature control of the heat exchanger 23 has reached 150° C., the switching unit 56 switches from a method of control of the heater temperature control unit 51 to a method of control of the heater temperature variable control unit 55. The heater temperature variable control unit 55 switches, in accordance with the tendency of the effective solid material temperature (PTs), from constant-temperature control based on the set temperature of 110° C. to a mode in which the heater 12 is controlled from 110 to 120° C. However, there is a possibility of overshoot occurring if the set temperature increases sharply, so the heater 12 is controlled with the set temperature increase width set at 0.1° C./1 min, for example. There is a time lag in the heat input to the vessel 11 from the heater 12, so temperature control of the heat exchanger 23 is continued from 150 to 200° C. in order to respond to this.

In step 3, overshoot may occur if heat input from the heater 12 to the vessel 11 finishes. In order to avoid this, temperature control of the carrier gas is changed from the heating side to the cooling side. That is to say, the temperature of the heat exchanger 23 is controlled from 200 to 110° C. from the tendency of the effective solid material temperature (PTs). If further cooling is required, the temperature is reduced to 110-50° C. in accordance with the tendency of the effective solid material temperature (PTs).

In step 4, when temperature control of the heat exchanger 23 reaches 110° C. (the set temperature of the heater in this mode of embodiment), the switching unit 56 switches from the method of control of the heater temperature variable control unit 55 to the method of control of the heater temperature control unit 51. Using a target temperature set by the heater temperature variable control unit 55 as a set temperature during the switching, the heater temperature control unit 51 controls the heater 12. The procedure returns to step 1 and temperature control continues.

Mode of Embodiment 3

Mode of Embodiment 3 describes the configuration of residual amount detection in the supply system of Mode of Embodiment 2.

In the supply system 1, a maximum target temperature (fourth threshold temperature) in a second set temperature range (e.g., 110-120° C.) is set at a point in time when the residual amount of precursor inside the vessel 11 reaches a replacement level.

A first residual amount detection unit 57 detects that the residual amount of the precursor inside the vessel 11 is at a replacement level, in a state in which the heater 12 is controlled at a maximum target temperature (fourth threshold temperature: 120° C.) in the second set temperature range, and at a point in time when the heat exchanger 23 is controlled at a maximum target temperature (second threshold temperature: 200° C.) in the first set temperature range (50-200° C.). The detected information is output (e.g., output by sound, voice, light, external transmission, or the like).

Mode of Embodiment 4

Mode of Embodiment 4 describes a configuration for detecting a residual amount in the supply systems of Modes of Embodiment 1, 2 and 3.

The flow rate regulating valve 34 (e.g., a needle valve) is disposed upstream of the mass flow meter 25 in the outward conduction line L2. The flow rate regulating valve 34 adjusts the flow rate of the carrier gas and the precursor gas. Furthermore, the pressure regulating valve 22 implements pressure control in accordance with the pressure measured by the pressure gauge 24. The flow rate regulating valve 34 is set in such a way that the opening degree of the pressure regulating valve 22 is fully closed at the point in time when the residual amount of the precursor inside the vessel 11 reaches the replacement level.

A valve opening degree detection unit (not depicted) detects the opening degree of the pressure regulating valve 22. A second residual amount detection unit 58 detects that the residual amount of the precursor inside the vessel 11 is at the replacement level when the valve opening degree detected by the valve opening degree detection unit exceeds a threshold value. The detected information is output (e.g., output by sound, voice, light, external transmission, or the like).

Mode of Embodiment 5

Mode of Embodiment 5 describes a configuration for detecting a residual amount in the supply systems of Modes of Embodiment 1, 2, 3 and 4. Furthermore, this mode of embodiment may also be a mode of embodiment of a precursor amount detection system and a precursor amount detection method therefor.

A first gate valve 31 is disposed downstream of the heat exchanger 23 and upstream of the pressure gauge 24 in the introduction line L1. A second gate valve 32 is disposed downstream of the pressure gauge 24 in the introduction line L1. A third gate valve 33 is disposed upstream of the flow rate regulating valve 34 in the outward conduction line L2.

After the supply system 1 has been stopped, a measurement unit (not depicted) measures an introduction time up to a point in time when the carrier gas has been introduced in a fixed amount per unit time by control afforded by the mass flow controller 21 and a threshold pressure higher than the vessel pressure when the supply system was stopped has been reached, in a state in which the third gate valve 33 and a sixth gate valve 36 have been closed and the first and second gate valves 31, 32 and a fifth gate valve 35 have been opened.

An introduction amount calculation unit (not depicted) calculates the amount of carrier gas introduced from the introduction time measured by the measurement unit and the fixed amount per unit time.

A spatial volume calculation unit (not depicted) calculates a spatial volume inside the vessel by correcting the vessel temperature from a difference between the vessel pressure when the supply system is stopped and a threshold pressure.

A precursor volume calculation unit (not depicted) calculates the volume of the precursor from the vessel volume and the spatial volume calculated by the spatial volume calculation unit.

A third residual amount detection unit 59 detects the residual amount of the precursor inside the vessel in accordance with the precursor volume calculated by the precursor calculation unit. The detected information is output in an analogue manner (e.g., it is transmitted to an external device).

An example of calculating the spatial volume will be described below.

First of all, based on the flow rate measured on the mass flow controller 21 side, if there is a flow for 1 min at 500 sccm, then 500 cc (0° C., 1 atm) of carrier gas ($N_2$) is moved. Here, the mass flow controller 21 may implement the function of the measurement unit and the introduction amount calculation unit.

When the carrier gas ($N_2$) is enclosed in the vessel 11 for which it is wished to measure the spatial volume X under a pressure of between 0.2 atm and 1.2 atm in a state of 120° C. (measured by the temperature gauge 13), for example, for the 500 cc of carrier gas ($N_2$), 500 [cc]/273.14 [K]×(273.14 [K]+120 [K])=719.7 [cc, 1 atm].

Here, the pressure rises to 1 atm so the spatial volume X inside the vessel 11 is 719.7 cc (this can be calculated by means of the spatial volume calculation unit).

If this spatial volume X (719.7 cc) is subtracted from the spatial capacity of the vessel 11 (fixed value), then it is possible to obtain the volume (residual amount) of the precursor (this can be calculated by means of the precursor volume calculation unit).

The control unit 50 comprises a memory for storing various types of data, control parameters and control procedures, etc.; and a communication unit for communicating with various elements. The control unit 50 may be formed by a dedicated device, a dedicated circuit, an information processing device, or a processor, or the like. The control unit 50 comprises elements 51-58, but need not be provided with all of these, and any elements may be selected for implementation.

Different Mode of Embodiment

As a different mode of embodiment to Modes of Embodiment 1-5 described above, a configuration may be adopted in which the vessel is heated by an oven instead of the heater 12. A temperature gauge for measuring the temperature inside the oven may be used instead of the heater temperature gauge 13. The oven may be controlled in accordance with a set temperature and the measured temperature of the oven in such a way that the measured temperature of the oven reaches the set temperature, rather than control being performed by the heater temperature control unit 51. A configuration in which the heater 12 and the oven are combined is equally feasible.

As a different mode of embodiment to Modes of Embodiment 1-5 described above, a concentration gauge for measuring the concentration of the precursor gas generated may be used instead of the mass flow meter 25. The effective solid material temperature (PTs) is calculated from the concentration measured by the concentration gauge.

The effective temperature calculation unit calculates the effective generation amount PQs using the following equation.

$$PQs=PQc\times Cs/(1-Cs)$$

Here, PQc is the flow rate [ml/min] of the carrier gas controlled by the mass flow controller 21, and Cs is a value measured by the concentration gauge (e.g., 50% means that Cs=0.5).

Next, the effective temperature calculation unit calculates the effective solid vapor pressure PPs using the following equation.

$$PPs=PQs\times PPt/(PQc+PQs)$$

Here, PQc is the flow rate [ml/min] of the carrier gas controlled by the mass flow controller 21, PPt is the pressure [Torr] inside the vessel measured by the pressure gauge 24, and PQs is the effective generation amount of the sublimation gas. It should be noted that as a different mode of embodiment, the pressure (PPt) inside the vessel may be a pressure measured by a pressure gauge (e.g., the pressure gauge 241 in FIG. 2) disposed in a pipe upstream of a flow rate regulating valve (e.g., a needle valve) in the outward conduction line.

Next, the effective temperature calculation unit calculates the effective solid material temperature (PTs) from the effective solid vapor pressure PPs and a vapor pressure curve (pressure [Torr]–temperature [K] curve) of the solid material.

The carrier gas temperature control unit controls the temperature of the carrier gas heating unit in accordance with the tendency of the effective solid material temperature (PTs). The vessel temperature variable control unit controls the vessel heating unit in a temperature region higher than the set temperature of the vessel heating unit in accordance with the concentration measurement result and/or the effective solid material temperature (PTs).

As a different mode of embodiment to Modes of Embodiment 1-5 described above, the pressure gauge 241 may be used and the effective solid material temperature (PTs) may be calculated from the pressure (PPt) measured by the pressure gauge 241, as shown in FIG. 2, instead of the mass flow meter 25 being used.

The pressure gauge 241 is disposed downstream of the position of the third gate valve 33 in the outward conduction line L2, and is disposed upstream of the needle valve 34. The pressure gauge 241 essentially measures the pressure inside the vessel 11. It should be noted that a configuration for measuring the internal pressure of the vessel 11 using the pressure gauge 24 may be adopted, instead of the pressure gauge 241 being used.

For example, when the precursor is a solid material and the precursor generation amount is controlled by pressure, the procedure is implemented as follows.

The set pressure SPt [Torr] inside the vessel is expressed by the following equation.

$$SPt = SPc + SPs$$

Here, SPc is the pressure in a state in which the carrier gas is flowing at SQc [SCCM] which is the set flow rate. SPs is the target solid vapor pressure.

The target solid vapor pressure SPs can therefore also be expressed by the following equation.

$$SPs = SPt - SPc$$

The effective solid vapor pressure PPs inside the vessel is calculated using the following equation.

$$PPs = PPt - PPc$$

Here, PPc is the carrier gas pressure in a state in which the carrier gas is flowing at the flow rate PQc [SCCM]. PQc is controlled to a constant flow rate by means of the mass flow controller 21, so the following equation is established.

$$SPc = PPc$$

The effective temperature calculation unit calculates the effective solid material temperature (PTs) from the effective solid vapor pressure PPs and a vapor pressure curve (pressure [Torr]–temperature [K] curve) of the solid material.

The carrier gas temperature control unit controls the temperature of the carrier gas heating unit in accordance with the target solid material temperature (STs) and the effective solid material temperature (PTs), in such a way that the target solid vapor pressure (SPs) is maintained.

The vessel temperature variable control unit controls the temperature of the vessel heating unit in accordance with the target solid material temperature (STs) and the effective solid material temperature (PTs).

(Method for Detecting the Amount of Precursor Using the Pressure Gauge 241)

An example of calculating the spatial volume and the precursor volume (residual amount) will be described below.

The pressure inside the vessel 11 is first of all measured by means of the pressure gauge 241 in a state in which the second gate valve 32 and a seventh gate valve 37 are closed and only the third gate valve 33 is open, and the measured value is stored (the stored pressure value is 1; e.g., 100 torr).

A set value of the mass flow controller 21 is then set to a desired value (e.g., 1000 sccm), and the fifth gate valve 35, first gate valve 31 and second gate valve 32 are opened (the sixth gate valve 36 and the seventh gate valve 37 remain closed). As a result, the carrier gas flows into the vessel 11 at the set flow rate of the mass flow controller 21. The first gate valves 31, 32 are closed at the point in time when the measurement pressure of the pressure gauge 241 has reached a predetermined value (e.g., 550 torr).

The measurement unit measures and stores a carrier gas introduction time, in other words a time T1 (e.g., 1 minute) for which the first gate valve 31 was open.

After the first gate valve 31 has been closed, there is a standby for a fixed time (e.g., for 1 minute) until the pressure and temperature stabilize, after which the pressure measurement value of the pressure gauge 241 is stored (the stored pressure value is 2; e.g., 500 torr). Furthermore, the temperature (stored temperature value 1, e.g. 100° C.) of the vessel 11 at the temperature gauge 13 at this time is measured and stored. The stored pressure value 2 is greater than the stored pressure value 1.

Here, sccm is the flow rate [cc/min] at 0° C. and 760 torr, so a carrier gas amount A [cc] flowing into the vessel 11 is the set value of the mass flow controller 21 (1000 [sccm])× open time T1 (1 minute) of first gate valve 31=1000 cc [under 0° C., 760 torr] (this can be calculated by means of the introduction amount calculation unit).

A gas amount B inside the vessel 11 before the carrier gas flows in is: spatial volume X [cc] inside vessel 11×stored pressure value 1 [100 torr]/760×273 [K]/273.14 [K]+stored temperature value 1 (100 [K])=X×0.096303 cc [under 0° C., 760 torr].

A gas amount C inside the vessel 11 after the carrier gas has flowed in is: spatial volume X [cc]×stored pressure value 2 [500 torr]/760×273 [K]/273.14 [K]+stored temperature value 1 (100 [K])=X×0.481515 cc [under 0° C., 760 torr].

Here, the relationship of the carrier gas amount A flowing into the vessel 11, the gas amount B inside the vessel 11 before the carrier gas flows in, and the gas amount C inside the vessel 11 after the carrier gas has flowed in is such that C−B=A, so the spatial volume X=1000/(0.481515−0.096303)=2595.971 cc (this can be calculated by means of the spatial volume calculation unit). If the abovementioned 2595.971 cc is subtracted from the spatial capacity of the vessel 11 (fixed value), then it is possible to obtain the volume (residual amount) of the precursor (this can be calculated by means of the precursor volume calculation unit).

In FIG. 2, the mass flow meter 25 may be present or absent. Furthermore, in FIG. 2, the pressure gauge 24 may be present or absent.

As a different mode of embodiment to Modes of Embodiment 1-5 described above, the precursor may be a liquid material instead of a solid material. The quantity of heat per mole is generally such that the heat of vaporization is around ¼ smaller than the heat of sublimation. Accordingly, the desired amount of vaporization gas can be delivered to a process using the same carrier gas temperature control as in Modes of Embodiment 1-5.

The precursor amount detection system and precursor amount detection method are not limited to those described in the abovementioned modes of embodiment, and the mode of embodiment shown in FIG. 3 is equally feasible. The precursor amount detection system 300 in FIG. 3 has a configuration in which a precursor S (solid or liquid) is received in a vessel 311, and the vessel 311 is heated by a heater 312. A carrier gas is fed into the vessel 311 through an inlet pipe L301, and a precursor gas is delivered to a latter process together with the carrier gas through an outlet pipe L302. A purge gas introduction pipe may also be provided in the same way as in Mode of Embodiment 1. Furthermore, a heating unit for heating the carrier gas may also be provided in the pipe L301. A first control valve 330, first pressure gauge 324, and second control valve 332 are arranged in succession in the carrier gas flow direction in the inlet pipe L301.

A third control valve 333 is arranged in the outlet pipe L302.

A precursor amount detection method will be described below.

(1) In a state in which the second control valve 332 is open, the first and third control valves 330, 333 are closed and a pressure value P0 of the first pressure gauge 324 disposed in the pipe L301 is measured. Here, the measurement value of the first pressure gauge 324 which is used may be a value measured in a stable state, or it may be a mean value of a plurality of measured values within a predetermined time.

(2) The first control valve 330 is opened and the carrier gas is made to flow into the vessel 311 at a fixed flow rate PQc [sccm] per unit time. An inflow time FT1 of the carrier gas is measured.

(3) When the measurement value of the first pressure gauge 324 has reached a predetermined value, the first control valve 330 is closed. Once it has been closed and after a predetermined time has elapsed, a pressure value P1 (corresponding to the threshold pressure) of the first pressure gauge 324 is measured. Furthermore, a temperature T1 of the vessel 311 at this time is measured by a temperature gauge 312. Here, the reason why the pressure is measured after a predetermined period has elapsed is that there is a standby for the pressure value to stabilize.

(4) The carrier gas amount A which has flowed into the vessel 311 is obtained by: $PQc \times FT1$.

(5) The gas amount B inside the vessel 311 before the carrier gas flows in is obtained by: spatial volume X [cc] inside vessel 311×pressure value P0/760 [torr]×273 [K]/273.14 [K]+temperature T1 [K]). Here, sccm is the flow rate (cc/min) at 0[° C.], 760 [torr].

(6) The gas amount C inside the vessel 311 after the carrier gas has flowed in is obtained by: spatial volume X [cc]×pressure value P1/760×273 [K]/273.14 [K]+temperature T1 [K]).

(7) The relationship of the carrier gas amount A, gas amount B, and gas amount C is such that C−B=A. The spatial volume X is obtained from this.

(8) By subtracting the spatial volume X from the spatial capacity of the vessel 311 (fixed value), it is possible to calculate the volume of the precursor. In addition, it is possible to calculate the weight of the precursor from the volume and the density of the precursor.

In the abovementioned mode of embodiment, it is equally possible for the first pressure gauge 324 to be disposed downstream of the third control valve 333 in the outlet pipe L302 on the downstream side, rather than in the inlet pipe L301, or a pressure gauge which is directly connected to the vessel 311 to measure the internal pressure thereof is equally feasible.

KEY TO SYMBOLS

1 . . . Supply system
11 . . . Vessel
12 . . . Heater
21 . . . Mass flow controller
22 . . . Pressure regulating valve
23 . . . Heat exchanger
24 . . . Pressure gauge
25 . . . Mass flow meter
34 . . . Flow rate regulating valve
51 . . . Heater temperature control unit
52 . . . Heat exchanger control unit
53 . . . Target temperature calculation unit
54 . . . Effective temperature calculation unit
55 . . . Heater temperature variable control unit
56 . . . Switching unit
57 . . . First residual amount detection unit
58 . . . Second residual amount detection unit
59 . . . Third residual amount detection unit It will be understood that many additional changes in the details, materials, steps and arrangement of parts, which have been herein described in order to explain the nature of the invention, may be made by those skilled in the art within the principle and scope of the invention as expressed in the appended claims. Thus, the present invention is not intended to be limited to the specific embodiments in the examples given above.

The invention claimed is:

1. A solid precursor supply method comprising:
a heating step in which a vessel containing a solid precursor is heated at a vessel set temperature by a vessel heating unit;
a main measurement step in which data relating to a gas of the solid precursor is obtained;
a carrier gas temperature control step in which a temperature of a carrier gas introduced into the vessel is controlled in a first carrier gas temperature range from a first carrier gas threshold temperature lower than the vessel set temperature up to a second carrier gas threshold temperature higher than the vessel set temperature;
a vessel temperature measurement step in which a temperature of the vessel heating unit is measured;
a vessel temperature control step in which the vessel heating unit is controlled based on the temperature of the vessel heating unit measured in the vessel temperature measurement step and based on the vessel set temperature of the vessel heating unit;
a vessel temperature variable control step in which the vessel heating unit is controlled in a vessel heating unit temperature range from a first vessel heating unit threshold temperature lower than the vessel set temperature up to a second vessel heating unit threshold temperature higher than the vessel set temperature; and
a switching step in which control of the vessel heating unit is switched between the vessel temperature control step and the vessel temperature variable control step;
a plurality of solid precursor temperature calculation steps in which a solid precursor temperature (PTs) is determined by comparing a calculated solid precursor vapor pressure (PPs), to a vapor pressure curve of the solid precursor and using the calculated PPs as the vapor pressure to thereby determine a vapor temperature that is deemed to be the solid precursor temperature (PTs), wherein the vapor pressure curve is a pre-existing pressure to temperature curve of a vapor phase formed from the solid precursor, and wherein the PPs is calculated by the equation PPs=PQs×PPt/(PQc+PQs), wherein PQc is a flow rate of the carrier gas, PPt is a pressure inside the vessel, and PQs is the flow rate of a sublimation gas formed from the solid precursor, further wherein PQs is calculate by a) subtracting a known flow rate of the carrier gas from a measured flow rate of the carrier gas mixed with the sublimation gas, or b) measuring a concentration of the sublimation gas in the gas stream leaving the container and calculating PQs with this value and the measured value PQc;

the method further comprising:

(1) (a) performing the vessel temperature control step and the carrier gas temperature control step concurrently, wherein the carrier gas temperature is above the vessel set temperature and at or below the second carrier gas threshold temperature, (b) further concurrently performing a first plurality of solid precursor temperature calculation steps to determine a first plurality of PTs values, and (c) continuing (1)(a) until one of the calculated PTs values from the first plurality of solid precursor temperature calculation steps is not greater than an immediately previous calculated PTs value from the first plurality of solid precursor temperature calculation steps and the PTs is below the vessel set temperature, wherein the first plurality of solid precursor temperature calculation steps to determine a first plurality of PTs values are performed by comparing a first plurality of calculated solid precursor vapor pressure (PPs), to the vapor pressure curve of the solid precursor and using the first plurality of calculated PPs as the vapor pressure to thereby determine the first plurality of vapor temperatures that are deemed to be the first plurality of solid precursor temperature (PTs), wherein the vapor pressure curve is a pre-existing pressure to temperature curve of the vapor phase formed from the solid precursor, and wherein the first plurality of PPs is calculated by the equation PPs=PQs×PPt/(PQc+PQs), wherein PQc is the flow rate of the carrier gas, PPt is the pressure inside the vessel, and PQs is the flow rate of a sublimation gas formed from the solid precursor, further wherein PQs is calculate by a) subtracting the known flow rate of the carrier gas from the measured flow rate of the carrier gas mixed with the sublimation gas, or b) measuring the concentration of the sublimation gas in the gas stream leaving the container and calculating PQs with this value and the measured value PQc;

(2) (a) switching from the vessel temperature control of step (1) to the vessel temperature variable control step, (b) concurrently performing the vessel temperature variable control step and the carrier gas temperature control step, wherein the carrier gas temperature is below the second carrier gas threshold temperature, (c) further concurrently performing a second plurality of solid precursor temperature calculation steps, wherein the second plurality of solid precursor temperature calculation steps to determine a second plurality of PTs values are performed by comparing a second plurality of calculated solid precursor vapor pressure (PPs), to the vapor pressure curve of the solid precursor and using the second plurality of calculated PPs as the vapor pressure to thereby determine the second plurality of vapor temperatures that are deemed to be the second plurality of solid precursor temperature (PTs), wherein the vapor pressure curve is a pre-existing pressure to temperature curve of the vapor phase formed from the solid precursor, and wherein the second plurality of PPs is calculated by the equation PPs=PQs×PPt/(PQc+PQs), wherein PQc is the flow rate of the carrier gas, PPt is the pressure inside the vessel, and PQs is the flow rate of a sublimation gas formed from the solid precursor, further wherein PQs is calculate by a) subtracting the known flow rate of the carrier gas from the measured flow rate of the carrier gas mixed with the sublimation gas, or b) measuring the concentration of the sublimation gas in the gas stream leaving the container and calculating PQs with this value and the measured value PQc, and (d) continuing (2)(b) until one of the calculated values PTs from the second plurality of solid precursor temperature calculation steps is above the vessel set temperature; and (3) (a) switching from the vessel temperature variable control of step (2) to the vessel temperature control step, (b) performing the vessel temperature control step and the carrier gas temperature control step concurrently, wherein the carrier gas temperature is below the vessel set temperature and at or above the first carrier gas threshold temperature, (c) further concurrently performing a third plurality of solid precursor temperature calculation steps, and (d) continuing (3)(b) and 3(c) until one of the calculated values PTs from the third plurality of solid precursor temperature calculation steps is not greater than an immediately previous calculated PTs value from the third plurality of solid precursor temperature calculation steps and said one of the calculated PTs values from the third plurality of solid precursor temperature calculation steps is at or below the vessel set temperature, wherein the third plurality of solid precursor temperature calculation steps to determine a third plurality of PTs values are performed by comparing a third plurality of calculated solid precursor vapor pressure (PPs), to the vapor pressure curve of the solid precursor and using the third plurality of calculated PPs as the vapor pressure to thereby determine the third plurality of vapor temperatures that are deemed to be the third plurality of solid precursor temperature (PTs), wherein the vapor pressure curve is a pre-existing pressure to temperature curve of the vapor phase formed from the solid precursor, and wherein the third plurality of PPs is calculated by the equation PPs=PQs×PPt/(PQc+PQs), wherein PQc is the flow rate of the carrier gas, PPt is the pressure inside the vessel, and PQs is the flow rate of a sublimation gas formed from the solid precursor, further wherein PQs is calculate by a) subtracting the known flow rate of the carrier gas from the measured flow rate of the carrier gas mixed with the sublimation gas, or b) measuring the concentration of the sublimation gas in the gas stream leaving the container and calculating PQs with this value and the measured value PQc.

2. The supply method as claimed in claim 1, further comprising a first residual amount detection step which detects when the residual amount of the solid precursor inside the vessel is at a replacement level.

3. The supply method as claimed in claim 2, wherein, during step (2), the vessel temperature variable control unit controls the vessel heating unit at the second vessel heating unit threshold temperature higher than the vessel set temperature and the carrier gas temperature control unit controls the temperature of the carrier gas heating unit at the second carrier gas threshold temperature higher than the vessel set temperature.

4. The supply method as claimed in claim 3, wherein the solid precursor is $AlCl_3$, the vessel set temperature is 110°

C., the second carrier gas threshold temperature is 200° C., and the second vessel heating unit threshold temperature is 120° C.

\* \* \* \* \*